US012689344B2

(12) United States Patent　　　(10) Patent No.:　US 12,689,344 B2
　　Koh et al.　　　　　　　　　　(45) Date of Patent:　　　Jul. 21, 2026

(54) CRYOGENIC PARAMETRIC AMPLIFIER CONTROL APPARATUS

(71) Applicant: Millimeter Wave Systems, LLC, Amherst, MA (US)

(72) Inventors: Christopher Tze-Chao Koh, Amherst, MA (US); Kenneth Ray Wood, Hadley, MA (US)

(73) Assignee: MILLIMETER WAVE SYSTEMS, LLC, Amherst, MA (US)

( * ) Notice: Subject to any disclaimer, the term of this patent is extended or adjusted under 35 U.S.C. 154(b) by 1198 days.

(21) Appl. No.: 17/625,449

(22) PCT Filed: Jul. 6, 2020

(86) PCT No.: PCT/US2020/040878

§ 371 (c)(1),
(2) Date: Jan. 7, 2022

(87) PCT Pub. No.: WO2021/007153

PCT Pub. Date: Jan. 14, 2021

(65) Prior Publication Data

US 2022/0263483 A1　　　Aug. 18, 2022

Related U.S. Application Data

(60) Provisional application No. 62/871,815, filed on Jul. 9, 2019.

(51) Int. Cl.
*H03F 7/04*　　　　(2006.01)

(52) U.S. Cl.
CPC ......... *H03F 7/04* (2013.01); *H03F 2200/447* (2013.01); *H03F 2200/451* (2013.01)

(58) Field of Classification Search
CPC ................. H03F 7/04; H03F 2200/447; H03F 2200/451; H03F 19/00
USPC .............................................. 330/124 R, 295
See application file for complete search history.

(56) References Cited

U.S. PATENT DOCUMENTS

| | | | | |
|---|---|---|---|---|
| 6,480,706 | B1 * | 11/2002 | Mimura | ................... H04B 1/18 455/140 |
| 7,327,996 | B2 * | 2/2008 | Chen | ........................ H04B 1/18 455/63.1 |
| 2002/0173343 | A1 * | 11/2002 | Narahashi | .............. H04B 1/036 455/562.1 |
| 2011/0301040 | A1 * | 12/2011 | Maiuzzo | ................ H04B 1/036 455/39 |

* cited by examiner

*Primary Examiner* — Khanh V Nguyen
(74) *Attorney, Agent, or Firm* — David J. Thibodeau; VLP Law Group LLP

(57) ABSTRACT

A cryogenic parametric amplifier control apparatus is disclosed. Methods of implementation and devices incorporated within the whole of the apparatus are disclosed. Methods of reducing the number of signal lines necessary to control a parametric amplifier are disclosed. Schema allowing for control of multiple parametric amplifiers with a single apparatus are disclosed.

11 Claims, 6 Drawing Sheets

CRYOGENIC PARAMETRIC AMPLIFIER CONTROL APPARATUS

STATEMENT OF GOVERNMENT RIGHTS

This invention was made with government support under Grant No. 1843017 awarded by the National Science Foundation (NSF) SBIR (small business grant). The government has certain rights in this invention.

LIST OF REFERENCES CITED

Patent Documents

| US 2018/0034425 | A1 | February 2018 | Bell et al. |

OTHER PUBLICATIONS

C. Macklin et al., "A near-quantum-limited Josephson traveling-wave parametric amplifier", Science Vol. 350, Issue 6258, Oct. 16, 2015, pp. 307-310 (Year: 2015).

TECHNICAL FIELD

The present disclosure is generally directed to control of amplifiers and more particularly to the control of cryogenic parametric amplifiers, and components that may be used in the control of cryogenic parametric amplifiers.

BACKGROUND

In the field of cryogenic radio frequency (RF) electronics, it is often necessary to pass signals from room temperature electronics to cryogenic electronics. Specialized hardware and cabling if often required to thermally isolate warm temperature equipment and to isolate Johnson thermal noise produced by room temperature conductors. This is particularly important for low noise electronics used in applications such as Radio Astronomy receivers and Quantum Information Systems. A common technique used to isolate warmer temperature noise is to attenuate RF signals at each cooling stage of the cryostat or cryogenic refrigerator. Components known as attenuators, often using three resistors arranged in a 'Pi' or 'T' configuration attenuate the RF signals while minimizing forward and reverse reflections, or equivalently, maintain RF matching. These attenuators will attenuate both desired signals and thermal noise from warmer electronics. The thermal noise is proportional to temperature, measured on a Kelvin scale, so the amount of attenuation needed at each step in the cooling stage to suppress noise from the previous stage needs to be greater, by some margin, than the ratio of temperatures of the stages. Many cooling stages are common in cryostats and cryogenic refrigerators. Some of these cryostats and cryogenic refrigerators have cooling capability down to the order of ten millikelvin (10 mK or −272.14° C.). For suppression of noise from room temperature electronics to below the intrinsic noise in conductors at the 10 mK level, the total attenuation for all stages is typically required to be on the order 60 dB. At each stage, the attenuators themselves will have intrinsic noise; this makes it important in practice to have the resistor elements in the attenuators in close thermal contact to their respective cooling stage, herein referred to as 'thermalized.'

In addition to attenuators, specialized wiring including coaxial cables for RF connections, is needed. It is therefore desirable to minimize the number of physical connections to reduce costs and to minimize physical space taken up by these connections. This is significant, for example, in quantum computers where higher density of electronics is desirable to produce more powerful computers with greater numbers of qubits.

Parametric amplifiers require pump signals to draw power from to amplify incident signals. These pump signals are supplied by a control system in a manner determined by the type of parametric amplifier (PA). A specific type of PA, quantum limited parametric amplifiers (QLPAs), require control systems tailored to the cryogenic environments they operate within. QLPAs are being developed and used for quantum computing and related quantum applications. The majority of these QLPA technologies operate at temperatures on the order of 10 mK within a cryostat or cryogenic refrigerator's lowest temperature stage. QLPAs also operate at the theoretical lowest limit of noise performance, and as such, are especially sensitive to added thermal noise on their pump and bias signals.

Early QLPAs had bandwidth so narrow as to only allow amplification of a single weak signal and used a single pump signal to operate (C. Macklin et al. 2015). Even in this relatively simple circuit with one weak signal in and one pump signal in, significant challenges faced the control schema. The pump signal much be combined with the weak signal incident on the QLPA. When the weak signal is produced by a qubit being used for a quantum computing application, a sufficiently large reflected weak signal or pump signal will influence the state of the qubit and corrupt its signal. Isolators specially designed for operation at these temperatures and to protect QLPAs and qubits from their magnetic fields are used together with a directional coupler to combine the pump signal and weak signal.

Noise on the pump signal also degrades the noise performance of the QLPA and must be reduced to the theoretical lower thermal noise limit. To achieve this, the pump signal is run through cryogenic resistor element attenuators placed at each temperature stage. These attenuators also can serve the dual purpose of lowering the power level of the pump signals to the operating power level of the QLPAs which is typically significantly lower than what bench top signal generators can provide.

Improvements to QLPA technologies have been made that require more than one pump signal and have much larger bandwidth, allowing for multiple incident weak signals to be amplified. US Patent 201810034425A1 discloses an asymmetric squid-based traveling wave parametric amplifier (TWPA) that can use two pump signals for wide bandwidth operation. This QLPA also requires DC bias to provide the magnetic flux necessary for operation and can be tuned to optimize performance at different points in the bandwidth. This trend of increasing numbers of signals, both DC voltages and higher frequency RF signals, necessitates a more complex control system to operate. Generating the pump signals, varying their power and frequency, varying the DC voltage, multiplexing the pump signals, combining with the incident weak signals: each of these tasks need to be performed by the control apparatus for each QLPA in the system. The complexity of operation of these QLPA control systems poses a significant barrier to the QLPA technologies adoption and use.

The size of current cryostats and cryogenic refrigerators limits how many signal lines can be run down through the temperature stages, and every stage needs a thermal noise filter or attenuator on each of those lines. One benchmark used to measure performance of a quantum computer is the number of qubits in its system. If every signal has its own line, coaxial or otherwise, run through the refrigerator, the physical limit of how many qubits a refrigerator can hold is reached rapidly. Multiplexing control signals on a single transmission line is one clear solution to that issue, but specialized cryogenic components are required to achieve this.

SUMMARY

In accordance with one or more aspects, systems of controlling parametric amplifiers, devices and components employed in those systems, and methods of implementing these systems of control are disclosed.

The disclosed control apparatus addresses both the increasing complexity of biasing improved parametric amplifier technologies and the scalability of parametric amplifier applications, such as quantum computers. The disclosed system in part comprises such elements as: bias tees (or 'bias-Ts'), resistor element attenuators, low-pass filters, cryogenic isolators, directional couplers, pump signal sources, power combiners, and parametric amplifiers. The control apparatus disclosed reduces the component count and physical space necessary for operation of parametric amplifiers while offering improved performance and tunability of the parametric amplifiers.

In some embodiments, DC and RF signals are multiplexed on a single coaxial transmission line passing through the temperature stages of a cryostat or cryogenic refrigerator using one or more bias-Ts.

In some embodiments, the multiplexed DC and RF signals are separated using a bias-T on the pump input of the parametric amplifier integrated circuit.

In some embodiments, the multiplexed DC and RF signals are instead separated using a bias-T on the output port of the parametric amplifier.

In some embodiments, two or more pump signals are combined onto a single transmission line traveling through at least one temperature stage of the cryostat or cryogenic refrigerator.

In some embodiments, a test signal to be amplified by the parametric amplifier is combined with one or more pump signals on a single transmission line traveling through at least one temperature stage of the cryostat or cryogenic refrigerator.

In some embodiments, one or more attenuators are placed in series with these transmission lines.

In some embodiments, DC signals are directed to bypass the attenuation placed on the transmission lines with an inductor, or similarly functioning component, that has good thermalization to its housing and is connected from the input to the output of the attenuator.

In some embodiments, bias-Ts or capacitors on the input and output of the attenuation path are used to block DC from the attenuation loss elements and prevent additional heating of the loss elements of the RF attenuating device.

In some embodiments, the DC path can also be attenuated, by an amount different from the RF attenuation using a resistor divider network or resistive coating.

In some embodiments, the inductor or similarly functioning component is thermalized using silver epoxy potting.

In some embodiments, a method is employed to limit the frequencies that can pass through the DC path to limit thermal noise integrated with the DC bypass attenuator or placed in the DC bypass pass to limit frequencies passed without attenuating the DC.

In some embodiments, frequencies on the DC path are filtered or otherwise limited to reduce thermal noise passing through the DC line and for general DC noise suppression use. The method comprises a low-pass filter constructed on a thermally conductive substrate such as natural quartz, Alumina or $SiO_2$. In some examples, a lossy non-superconducting sputtered material, such as NiCr, is applied on top of the planar inductor. The inductor could be a meander, a spiral, or high-Z low-Z elements forming a low-pass structure. The lossy material will attenuate at high frequencies, higher than the cut-off of the low pass filter, and prevent re-entrant high frequency noise. Heat dissipated in the filter structure or in the lossy material will be efficiently conducted through the substrate material to the mounting material/base. The substrate may be mounted to a thermally conductive material such as aluminum or copper.

In accordance with another aspect, the number of pump signal lines for a multitude of amplifiers that share the same pump frequency(s) can be reduced using a cryogenic microwave power divider or combiner at a lower temperature stage. This will reduce the number of connections needed through the cooling layers when multiple parametric amplifiers are used. The pump power division need not be equal and may be set to provide the optimal pump power to each amplifier using an un-equal power split or with customized attenuation values on each pump input.

In some embodiments, DC bias adjustments are made at the DC input of each parametric amplifier.

In some embodiments, the cryogenic amplifier performance is tuned and optimized using a test signal introduced by the control apparatus. The test signal may be combined with one or more pump signals. The test signal is monitored through the output chain. The control apparatus may detect the test signal using a microwave detector, homodyne receiver, or similar functioning device. Multiple parametric amplifiers may be controlled by a single apparatus and the test signal may be monitored by switching between the outputs of different amplifiers using an RF switch.

In accordance with another aspect, multiple parametric amplifier outputs may be combined through a power divider or combiner at a lower temperature stage than room temperature. This will act to multiplex the outputs and further reduce the connections required for room temperature electronics. The amplifiers could be the first stage quantum-limited parametric amplifier, or in subsequent amplifier stages, such as transistor-based amplifiers, at higher temperatures.

In some embodiments, the test signal introduced by the control apparatus performance is monitored by selectively enabling the DC bias to the amplifier under test.

In accordance with another aspect, any incident test signals and pump signals are integrated at the input of the parametric amplifier with a directional coupler of the form: microstrip, strip line or coplanar, mounted in the same package as the amplifier.

BRIEF DESCRIPTION OF DRAWINGS

The disclosed drawings are not intended to be drawn to scale. Every identical or nearly identical component that is illustrated in the various figures is represented by a like numeral. For purposes of clarity, not every component may be labeled in every drawing. In the drawings.

DETAILED DESCRIPTION

Figure 1:
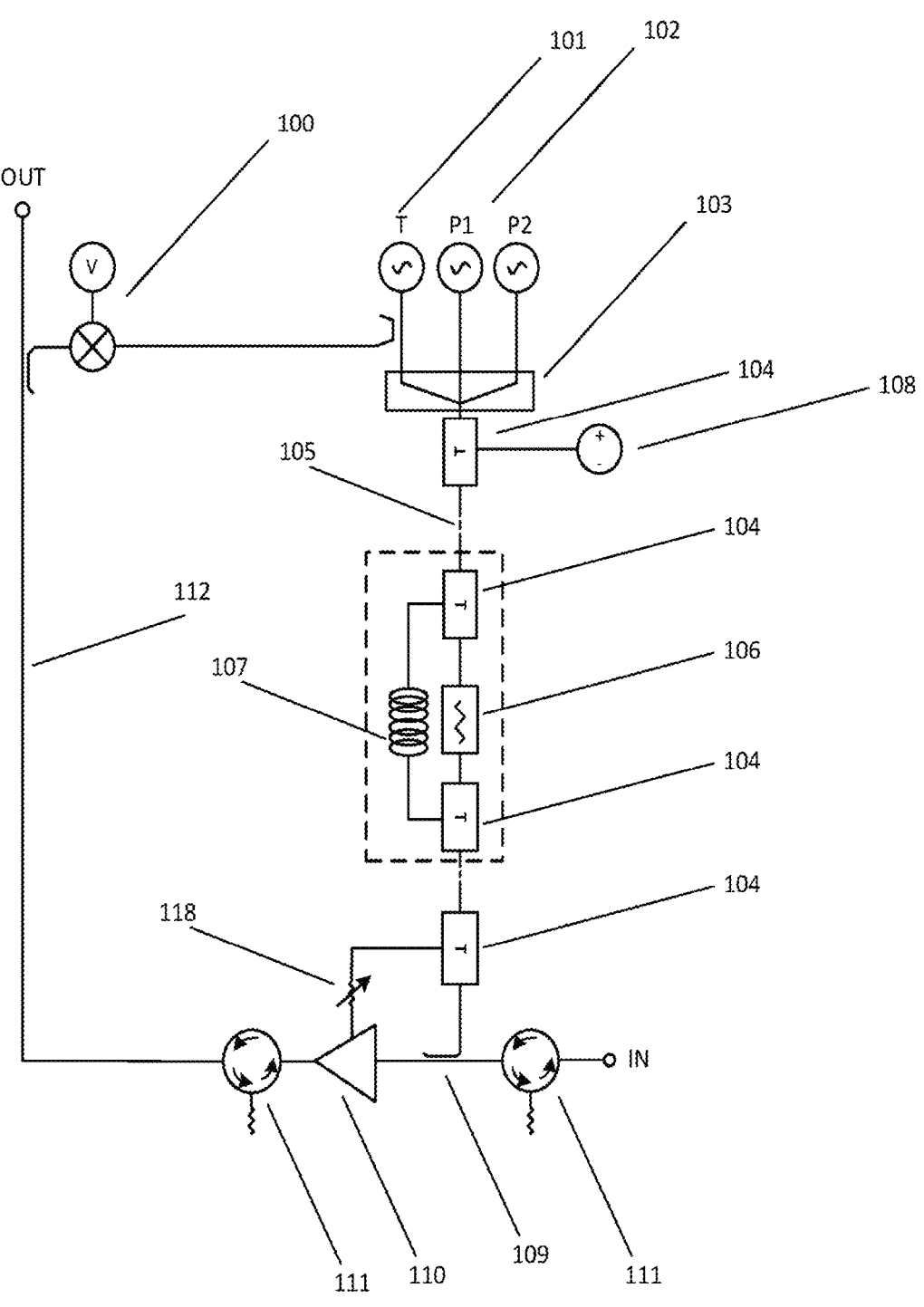
FIG. 1 is a block diagram of an example control apparatus for an amplifier requiring both DC and RF signals with one or more stages of attenuation and DC bypass path filtering and or attenuation. The multiplexed DC and RF signals are split by a bias-T at the RF control signal input to the amplifier.

An object of the invention is to multiplex RF and DC signals onto single coaxial connections to reduce the connections required through the cryostat or cryogenic refrigerator. An example of a control circuit for an amplifier 110 requiring both DC and RF signals is shown in FIG. 1. A bias-T 104 is used at the room temperature to combine or multiplex RF and DC signals onto a single coaxial transmission line 105. Here, 'bias-T' refers to any scheme or device with three or more ports and one or more frequency filtering elements that result in at least three port-to-port paths having different passing bandwidths and isolation frequency bandwidths from one another. The signals on the line 105 are then separated again at the final cold temperature stage of the cryostat or cryogenic refrigerator using another bias-T.

One potential application is for biasing amplifiers such as low noise HEMT or HBT amplifiers that require both DC bias and RF signals to be supplied within a cold stage of a cryostat or cryogenic refrigerator. Another application is for traveling wave parametric amplifiers (TWPAs), a subset of quantum limited parametric amplifiers (QLPAs), that require magnetic field-producing bias connections.

The TWPA disclosed in U.S. Pat. No. 10,516,375 B2 requires both RF signals and DC signals for operation. For simplification purposes, and generalization to the applications discussed, what are herein referred to as 'RF signals' are to be taken as electromagnetic signals with frequencies typically greater than 1 MHz. Likewise, 'DC signals' refer to electromagnetic signals with frequencies typically less than 1 MHz. 'DC' in the context herein is taken as the low-pass side of a frequency crossover network that includes 0 Hz. In a parametric amplifier, RF signal may provide a 'pump', from which power is drawn from through wave mixing on the parametric amplifier's transmission line. This pump signal(s) 102 may be typically injected into the amplifier at its input. The DC signal 108 may be used to generate a magnetic bias field though a superconducting trace or wire in proximity to the TWPA's non-linear elements. A directional coupler 109 is typically used for injection of one or more pumps and provides isolation of those pumps in the signal source direction. The level of isolation is limited by the coupler isolation and the match into the TWPA. In some cases, multiple pump signals can be used, allowing for varied amplification bandwidth of input weak signals. Herein 'weak signals' refer to signals incident to the amplifier being controlled, typically from a device under test, such as a qubit, or some other observable source wished to be observed. The use of 'weak' is appropriate because in order to see appreciable gain of any incident signals on the output of a parametric amplifier, those incident signals much be significantly lower in power level than any supplied pump signals.

A further object of the invention is to combine multiple pump signals 102 using one or more couplers, power combiners, or similar combining devices 103, to combine multiple pumps prior to their input to one or more bias-Ts 104 at room temperature. In this arrangement, all pumps and DC are combined on a single transmission line 105. In addition to the pump or pumps, a test signal 101 can also be combined, through similar means, and occupy the same path as the multiplexed DC/pump transmission line 105. The test signal 101 could serve as a surrogate to the input signal to the amplifier and, when detected by warmer temperature electronics 100, could be used for monitoring and optimization of amplifier performance. The test signal could be stepped or swept in frequency to characterize the frequency-gain response of the amplifier. This detection of the test signal can be done at whatever stage in the cryostat or cryogenic refrigerator is most convenient. Currently, this is typically done at room temperature, but detection of the test signal can be easily performed at an intermediate stage, such as the 4K (−268.15° C.) stage, particularly if circuitry is already being used there for signal generation and control.

Figure 2:
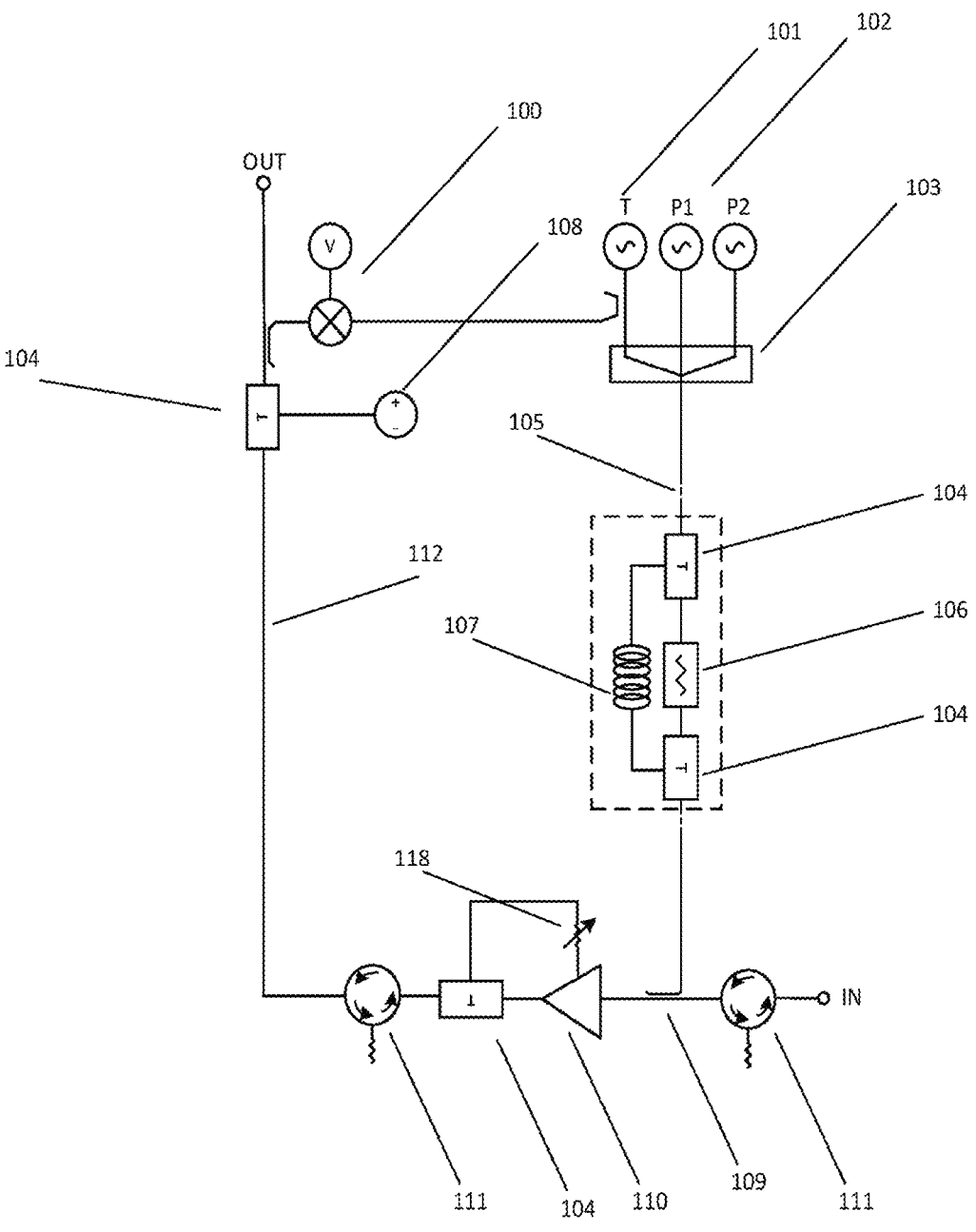
FIG. 2 is a block diagram of an example control apparatus for an amplifier requiring both DC and RF signals with one or more stages of attenuation and DC bypass path filtering and or attenuation. The DC signal is multiplexed with the output signal from the amplifier and split by a bias-T on the output of the amplifier.

A further object of the invention is shown in FIG. 2 where a bias-T is on the RF output signal transmission line 112 instead of the pump transmission line 105 in order to multiplex the DC with the RF output, as an alternative to combining the DC bias with the pump. The option to use this configuration may be desirable given the wide variety of applications and approaches to these cryogenic amplifier technologies. Another reason may be to place the added insertion loss of the bias-Ts 104 on the output line rather than RF control signal line. Typically, this will not be the case as added loss on the output decreases the overall gain of the system. However, in cases where there is ample or excess gain, but the system is starved for RF control signal power, such a configuration may become desirable.

Depending on the application and hardware, it may be desirable to have different amounts of attenuation used on the DC signal and RF signal. When the DC and RF are combined on a single conductor, both will be attenuated the same amount when passing through a typical resistor element attenuator 106. To overcome this limitation, one embodiment of the invention includes a method of integrating a DC bypass path with an inductor so that the DC signal is not attenuated while the RF is. We further propose a DC blocking capacitor be used to isolate the DC signal from the resistive elements of the attenuator 106 and keep power from being dissipated in those elements. This is especially important at the lower temperature cooling stages both because a hot conductor element will add extra Johnson thermal noise with fewer attenuation stages left to filter it out and because the lower temperature stages of cryostats and cryogenic refrigerator have much smaller heat removal capabilities.

Cryogenic bias-Ts could also be used to split the RF and DC from the single line prior to attenuation and then recombined with a second bias-T. By adding a DC attenuator or resistor divider in the DC path 107, the DC signal can also have attenuation, but different from than that of the RF path. A compact way of achieving different levels of attenuation on the RF and DC signals is to add attenuation to the DC bypass path with resistive elements or a lossy resistive coating. In addition to this attenuation of the DC signal, it is also desirable to filter off higher in frequency signals in the DC path that may re-enter above the operational frequency range of the bias-Ts. These high frequency signals can add Johnson noise to the DC path that is undesirable.

Another object of the invention is a non-reentrant low-pass filter on the DC path that is incorporated with the attenuator, in the DC bypass path 107, to provide thermal noise filtering without additionally attenuating the DC signal. In all of the configurations of attenuating and filtering the DC signal(s) separately from the RF signal(s) when they are multiplexed on a single transmission line, the power dissipated in the inductors, used to choke off the RF from the DC bypass, and resistors are a concern and should be well thermalized. To improve the thermal conduction and keep the entire inductor coil as close to the housing temperature as possible, a further object of the inventions is the potting of the inductor with a thermally conductive epoxy, such as a silver-loaded epoxy. The method could vary slightly depending on the choice of inductor, but for a wire-wound inductor the epoxy is spread over the surface of the windings to create a low thermal resistance path between the housing and the inductor windings. Note that wire wound inductors typically have electrically insulating coatings that are very thin and will not add significantly to the thermal resistance while providing necessary electrical insulation of the wire.

Figure 3:
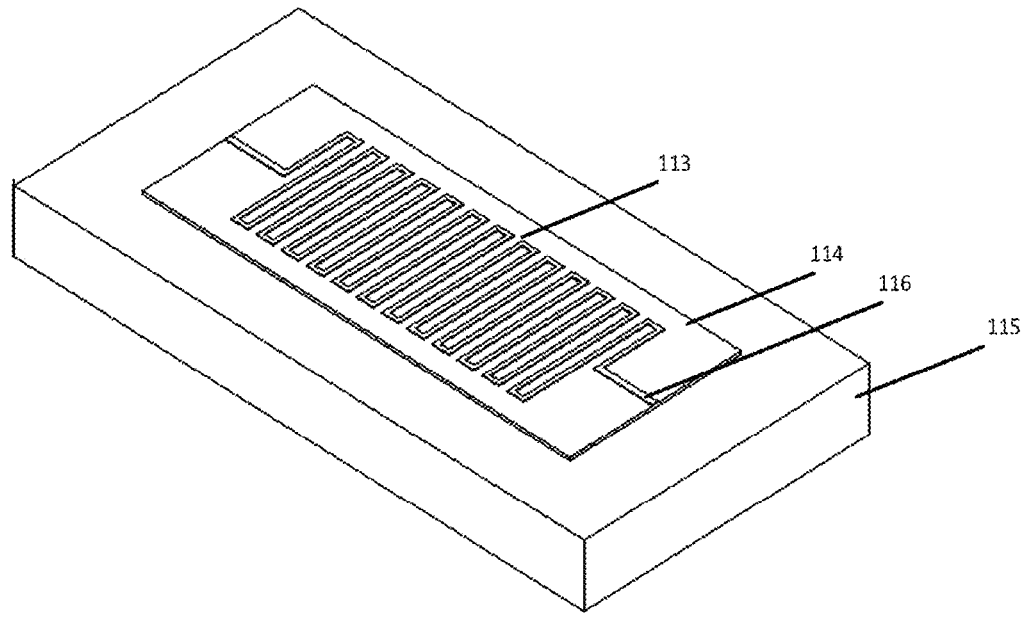
FIG. 3 is diagram of an example meandered strip line filter.

In one embodiment, the filtering device 107 is constructed of a transmission line and includes a two-dimensional series inductor such as a meander, spiral, or Low-z/high-Z structure forming a low-pass filter. The inductor acts to choke microwave energy by presenting a high impedance that increases with frequency according the formula, $$X_L = 2\pi f L,$$

where $X_L$ is the inductive reactance in ohms, f is the frequency in Hertz, and L is the inductance of the inductor in Henries. The reflection coefficient, given by, $$\Gamma = \frac{\left(\frac{z_L}{z_0} - 1\right)}{\left(\frac{z_L}{z_0} + 1\right)},$$

approaches unity for large values of f and will act to filter high frequency thermal noise. In practice, the reactance of the inductor will increase above self-resonance due to stray capacitance resulting in diminished reactance. The addition of a lossy material within the series inductor EM fields produces an imaginary propagation constant to the propagating modes resulting in losses that increase with frequency for a constant length of the inductor's transmission line. These losses produce heating of the lossy layer and heat must be carried away through weak electron-photon interaction. More generally, the inductor will produce its own thermal noise proportional to its temperature. For these reasons, the inductor and lossy layer are fabricated in close contact with a thermally conductive transport medium. One possible embodiment shown in FIG. 3 is a 50-Ohm microstrip transmission line 116 fabricated as a gold metallization on a quartz dielectric substrate 114 with TEM propagating modes. A series meander-line inductor 113 is fabricated on the substrate to form an inductor. A thin nichrome layer is deposited over the dielectric to form a lossy layer. A non-functional layer of SiO2 may be added on top to passivate the NiCr layer. The substrate may be mounted onto a heatsink or housing 115 made from a material with good thermal conduction, such as oxygen-free copper, using a thermally conductive adhesive, such as silver-loaded epoxy. Transitions to standard SMA connectors could also be incorporated into the housing and used to interface between the microstrip transmission line 116 and coaxial interfaces.

An additional object of the invention is a method for further reducing the number of connections required in cryogenic systems that have multiple cryogenic parametric amplifiers. The method is comprised of one or more source at room temperature that may be combined on a single line, and/or multiplexed with a DC signal, and connected through the cooling layers of the cryostat or cryogenic refrigerator. Attenuator components 106 may be used to attenuate the pump signal(s) in the same manner as when controlling a single amplifier. Typically, multiple sources and multiple connections with multiple sets of attenuators have been used. With the addition of cryogenic power divider at a cooled stage 117 within the cryostat or cryogenic refrigerator, a single control line is shared among multiple amplifiers. The power division does not need to be equal and can be adjusted to provide different pump powers to the multitude of amplifiers. One embodiment would be to have un-even power division in the microwave power divider. Another embodiment would be to add trimming attenuator pads to each of the outputs of the power divider to adjust the pump power levels. For amplifiers that that support gain separated from the pump signals, such as the TWPA disclosed by US patent 2018/0034425 A1, multiple frequency-separated amplification channels can operate from the same pump frequency. Many amplifier types require a DC bias for operation. In the case of the asymmetric SQUID-based TWPA disclosed by US patent 2018/0034425 A1, DC bias may be used to supply the magnetic flux required. While not technically required, as an external magnetic field may be applied to the TWPA during operation, the implementation of that external field takes up significant space and is not desirable for applications with high component counts. If DC bias is combined with the microwave pump signal, using the method described previously herein, the DC bias will nominally be constant across all amplifiers. In one embodiment, the amplifiers have different DC bias levels produced by voltage adjustors 118 such as resistor divider networks.

Figure 4:
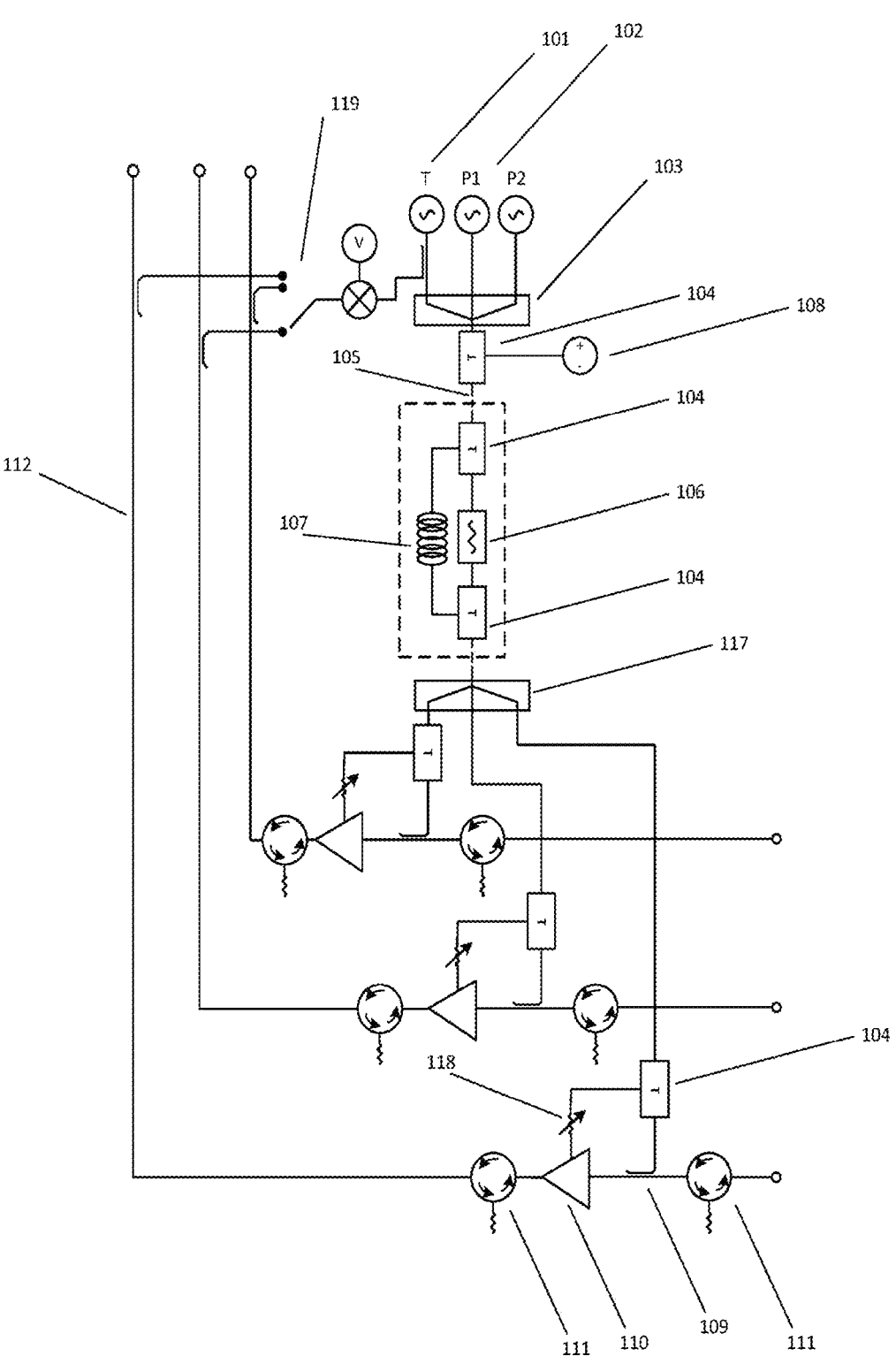
FIG. 4 is a block diagram of an example control apparatus whereby multiple amplifiers are controlled using a single line whose signals are divided and then distributed to each amplifier. The output signal may be detected by a series of couplers and a switch to select which amplifier to monitor.
Figure 5:
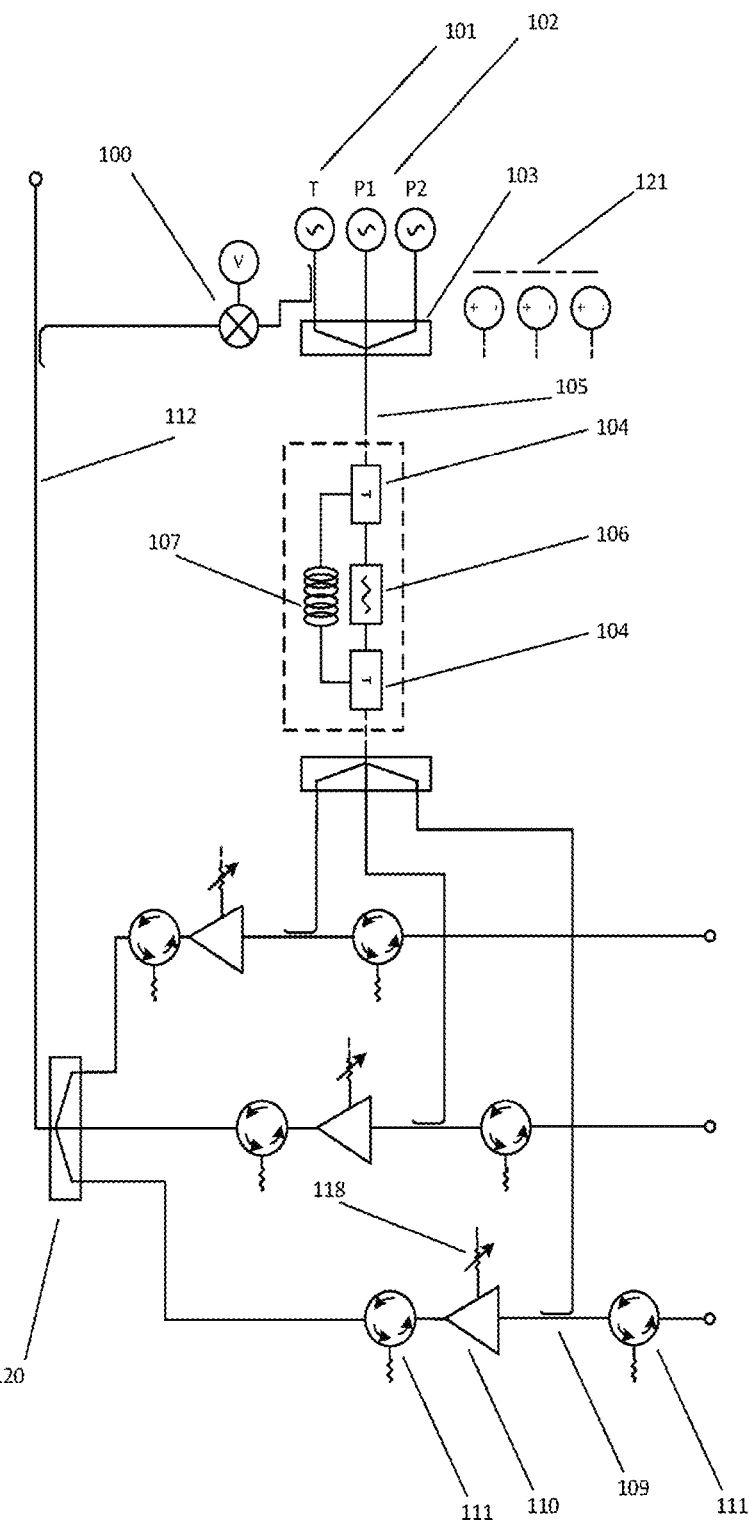
FIG. 5 is a block diagram of an example control apparatus whereby multiple amplifiers are controlled using a single RF line whose signals are divided and then distributed to each amplifier. The outputs of the amplifiers are combined onto a single line. Separate DC bias lines are run to each amplifier in this diagram.

In addition to pump sharing, the addition of a test signal 101, combined with the shared pump 102, can be shared. The test signal would share the same connection through the cooling layers of the cryostat or cryogenic refrigerator as the shared pump. The test signal is injected along with the pump into each amplifier. By monitoring the output levels at the test frequency, the parametric performance of each amplifier (e.g. gain, gain compression) could be measured. As shown in FIG. 4, the amplified test signals are monitored by a microwave homodyne receiver 119 that can be switched in the room temperature electronics between the various outputs. The test signal can be used to tune the performance of the amplifier. For example, the amplifier gain can be maximized at the test frequency while adjusting the DC bias or pump power to determine optimal values of DC and pump levels. The test frequency could also be stepped or swept across the frequency band of interest so that optimal DC and pump levels can be determined for many frequencies, or globally optimized over a range of frequencies.

An additional invention comprising an output combiner 120 connected to the outputs of a multiple amplifiers at a cooled stage would reduce the number of output connections through the cooling layers of the cryostat or cryogenic refrigerator. For the application where qubit signals are incident on each amplifier, each qubit would be distinct in frequency or separated in the time domain so that the information associated with each qubit may be separately detected by the detection apparatus. In the case where both the pump signals and amplifier outputs are combined for device characterization at cooled temperatures, a common test signal could still be used to tune the performance in the method described in the previous paragraph, however some means of selecting an individual amplifier under test would need to be used. One such means is to separate DC bias connections 121 for each amplifier, in one embodiment, so that only the DC bias-To the amplifier of interest is enabled. It is generally easier to implement DC bias connections than the output RF connections, so this configuration still results in an overall simpler readout architecture with built-in-test capability than the configuration the previous paragraph describes.

Figure 6:
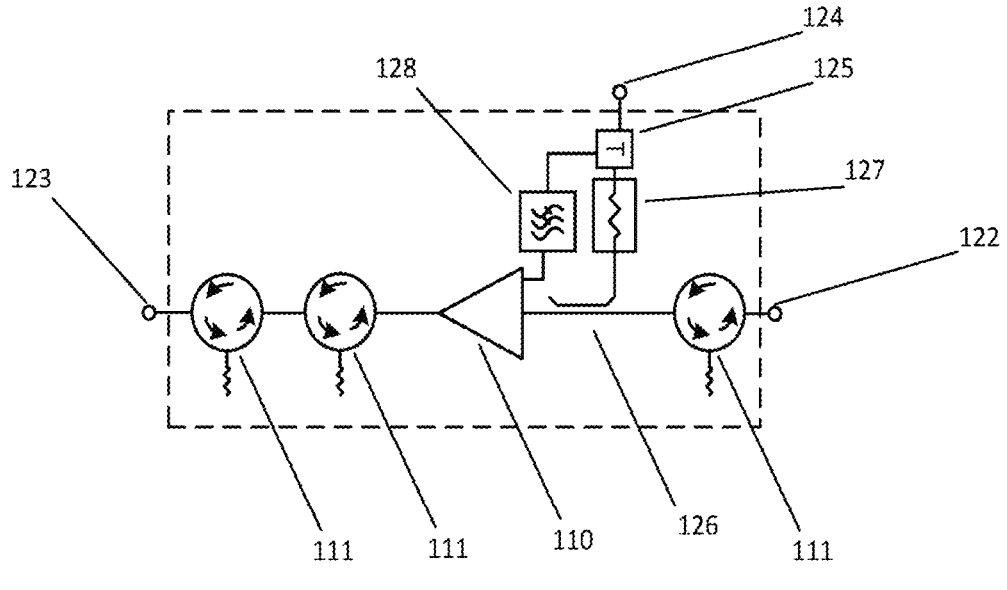
FIG. 6 is a block diagram of one possible configuration of components that may be integrated into a single housing.

Another invention is a single component that integrates the: amplifier input 122; output 123; and pump signal, DC bias signal and test signal 124, into one component. A block diagram of one such integrated configuration is shown in FIG. 6. The bias-T 125 separates the pump signal from DC bias. An integrated microwave coupler 126 directionally couples the pump with the input signal. The directivity of the coupler reduces the amount of the pump signal that goes back toward the input and could interfere with the quantum state of the qubit. The pump can be mixed with a test signal when characterizing the performance of the parametric amplifier. In one possible embodiment, an isolator 111 is used at the input of the component to provide additional isolation from the weak signal source. In another embodiment, isolators on both the input and output of the amplifier are used and provide additional isolation from components further down the chain. This is desirable because the parametric amplifier often may not provide sufficient reverse isolation. In another embodiment, an integral DC bias adjustment, possibly in the form of resistor divider, is used to control the DC bias level within the amplifier. In another embodiment, after splitting the DC and RF within the integrated component, the DC signal may be filtered 128 prior to injection to the amplifier. In another embodiment, the RF may be attenuated 127 within the package prior to injection to the amplifier.

Described above include several examples of control systems and parametric amplifier technologies in various applications. It is not possible to describe every conceivable combination of components, products, and/or parametric amplifier technologies for purposes of describing this disclosure. One skilled in the art can recognize that many further combinations and permutations of this disclosure are possible. The descriptions of the various embodiments have been presented for purposes of instruction but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of multiplexing outputs of two or more cryogenic amplifiers housed within a cryogenic system, the method comprising:

disposing a power divider/combiner onto a cooling stage, the cooling stage-operating at a lower temperature than room temperature;

coupling respective ones of the two or more outputs to corresponding input ports of the power divider/combiner, to thereby reduce a number of connections through at least one stage of the cryogenic system;

combining a test signal with one or more pump signals fed to the cryogenic amplifiers;

monitoring the test signal at one or more outputs of the cryogenic amplifiers; and wherein the monitoring further comprises detecting the test signal via a microwave detector or homodyne receiver, or by selectively enabling a DC bias to one or more of the cryogenic amplifiers.

2. A method of multiplexing outputs of two or more cryogenic amplifiers housed within a cryogenic system, the method comprising:

disposing a power divider/combiner onto a cooling stage, the cooling stage-operating at a lower temperature than room temperature;

coupling respective ones of the two or more outputs to corresponding input ports of the power divider/combiner, to thereby reduce a number of connections through at least one stage of the cryogenic system;

combining, with the power divider/combiner, output signals from two or more of the cryogenic amplifiers to generate a single combined output signal; and routing the combined output signal away from the cooling stage along a transmission path toward room-temperature electronics, thereby decreasing a number of signal lines that traverse the cooling stage.

3. The method of claim 2, wherein the cooling stage is a 50 K stage, a 4 K stage, a still stage, a cold-plate stage or a mixing-chamber stage of a cryogenic refrigerator.

4. The method of claim 2, further comprising filtering the combined output signal with a cryogenic low-pass or band-pass filter located on the cooling stage with the power divider/combiner.

5. The method of claim 2, further comprising supplying a DC bias to each of the cryogenic amplifiers through bias lines that are thermally anchored at multiple temperature stages of the cryogenic system.

6. A method of multiplexing outputs of two or more cryogenic amplifiers housed within a cryogenic system, the method comprising:

disposing a power divider/combiner onto a cooling stage, the cooling stage-operating at a lower temperature than room temperature;

coupling respective ones of the two or more outputs to corresponding input ports of the power divider/combiner, to thereby reduce a number of connections through at least one stage of the cryogenic system; and disposing a cryogenic isolator or circulator between each amplifier output and the corresponding input port of the power divider/combiner.

7. The method of claim 6, wherein a combined output signal provided by the power divider/combiner is fed through a single coaxial cable that exits the cryogenic system.

8. The method of claim 6, wherein the cooling stage is a 50 K stage, a 4 K stage, a still stage, a cold-plate stage or a mixing-chamber stage of a cryogenic refrigerator.

9. The method of claim 6, further comprising filtering a combined output signal provided by the power divider/combiner with a cryogenic low-pass or band-pass filter located on the cooling stage with the power divider/combiner.

10. The method of claim 6, further comprising supplying a DC bias to each of the cryogenic amplifiers through bias lines that are thermally anchored at multiple temperature stages of the cryogenic system.

11. A method of multiplexing outputs of two or more cryogenic amplifiers housed within a cryogenic system, the method comprising:

disposing a power divider/combiner onto a cooling stage, the cooling stage operating at a lower temperature than room temperature;

coupling respective ones of the two or more outputs to corresponding input ports of the power divider/combiner, to thereby reduce a number of connections through at least one stage of the cryogenic system;

providing a test signal tone into at least one input port of the power divider/combiner; and monitoring the test signal at the combined output to characterize the cryogenic system.

\* \* \* \* \*